(12) United States Patent
Lacombe et al.

(10) Patent No.: US 8,872,530 B2
(45) Date of Patent: Oct. 28, 2014

(54) METHOD FOR CORRECTING THE VOLTAGE MEASURED ACROSS THE TERMINALS OF A SENSOR

(75) Inventors: Bertrand Lacombe, Paris (FR); Nicolas Geneste, Longpont-sur-Orge (FR); Marc Raes, Brunoy (FR)

(73) Assignee: Sagem Defense Securite, Paris (FR)

( * ) Notice: Subject to any disclaimer, the term of this patent is extended or adjusted under 35 U.S.C. 154(b) by 0 days.

(21) Appl. No.: 14/110,028

(22) PCT Filed: Apr. 2, 2012

(86) PCT No.: PCT/FR2012/050713
§ 371 (c)(1),
(2), (4) Date: Feb. 6, 2014

(87) PCT Pub. No.: WO2012/136923
PCT Pub. Date: Oct. 11, 2012

(65) Prior Publication Data
US 2014/0145737 A1    May 29, 2014

(30) Foreign Application Priority Data

Apr. 5, 2011  (FR) ..................................... 11 52939

(51) Int. Cl.
*G01R 31/26*  (2014.01)
*G01R 35/00*  (2006.01)
*G01D 3/036*  (2006.01)
*G01L 1/22*   (2006.01)
*G01D 3/00*   (2006.01)

(52) U.S. Cl.
CPC .............. *G01R 35/005* (2013.01); *G01D 3/036* (2013.01); *G01L 1/2262* (2013.01); *G01D 3/00* (2013.01)
USPC ..................................... 324/713; 324/750.06

(58) Field of Classification Search
CPC ........ G01D 3/00; G01D 3/036; G01L 1/2262; G01K 15/00; G01K 7/16; G01K 1/20
USPC .............................................. 324/713, 750.06
See application file for complete search history.

(56) References Cited

U.S. PATENT DOCUMENTS 5,700,090 A  * 12/1997 Eryurek ..................... 374/210
6,519,546 B1 *  2/2003 Eryurek et al. ............. 702/130
2003/0147451 A1    8/2003 Temple-Boyer et al.

FOREIGN PATENT DOCUMENTS

FR    2 542 081    9/1984
FR    2 805 889    9/2001

OTHER PUBLICATIONS

International Search Report Issued Aug. 10, 2012 in PCT/FR12/050713 Filed Apr. 2, 2012.

*Primary Examiner* — Arleen M Vazquez
*Assistant Examiner* — Son Le
(74) *Attorney, Agent, or Firm* — Oblon, Spivak, McClelland, Maier & Neustadt, L.L.P.

(57) ABSTRACT

A method for correcting measurement of a voltage across output terminals of a sensor, the sensor configured to be assimilated with an assembly including a generator and a series resistance, each of the output terminals being respectively connected to a pull up/down resistor. The method includes: evaluating the series resistance of the sensor, including measuring first and second voltages across the output terminals when first and second bias voltages are applied on each pull up/down resistor; evaluating the series resistance from the first and second voltages; and correcting, from the series resistance, a voltage measured across the output terminals of the sensor to infer therefrom a corresponding voltage generated by the generator.

17 Claims, 2 Drawing Sheets

METHOD FOR CORRECTING THE VOLTAGE MEASURED ACROSS THE TERMINALS OF A SENSOR

BACKGROUND OF THE INVENTION

The invention relates to the general field of sensors, such as for example temperature, pressure, displacement sensors, etc.

More particularly, it relates to the compensation of measurement errors related to the output impedance of a sensor.

The invention has a preferential but non-limiting application in the aeronautical field, where many sensors are used (on-board an aircraft for example).

In practice, a sensor is generally connected to a digital computer which is responsible for receiving and processing measurement data transmitted from the sensor, the sensor and the digital computer thus being part of an acquisition chain.

Now, it is known that, when a sensor which may be assimilated to an equivalent voltage generator in series with the source impedance is connected to a digital computer having finite input impedance, a measurement error occurs if the ratio between the output impedance of the sensor and the input impedance of the computer is not negligible. This undesirable error occurs systematically and directly depends on the type of sensor and on the relevant computer.

In reality, even when the type of sensor is set for a given application, significant variations of the equivalent series impedance of the sensor often appear from one part to the other (production variations). In this case, it is usually possible to at best compensate for half the error due to the variation of the equivalent series impedance of the sensor.

Further, for certain types of sensors (potentiometers for example), a variation of impedance may even occur depending on the measured point of this equivalent series impedance. In this case, the equivalent series impedance variation resulting from the measurement point generates an error which varies non-linearly depending on the measurement point. This non-linear error may theoretically be compensated but the required compensation strongly complicates the algorithm for converting the measurement into a physical quantity at the digital computer, which most often leads to the use of approximation functions which simplify this algorithm at the expense of the attained accuracy.

For certain sensors, the error induced by these differences in impedance may be significant, reaching through to the maximum total error which is tolerated for the relevant acquisition chain (set to 1% for example). This impedance error will thus be added to the other inaccuracies which generally affect an acquisition chain.

Therefore there exists a need for compensating in a simple, rapid and efficient way for the measurement error affecting a sensor connected to a digital computer, and more particularly when this computer has non-negligible equivalent series impedance against the input impedance of the computer (also called "conditioner").

Further, a same computer may be designed for processing different types of sensor, each sensor having its own output impedance, which is unknown. Therefore it is not possible to apply error compensation a priori since the error will vary according to the sensor used.

OBJECT AND SUMMARY OF THE INVENTION

For this purpose, the invention relates to a method for correcting the measurement of a voltage across the output terminals of a sensor, wherein the sensor can be assimilated to an assembly comprising a generator and a series resistance, each of the output terminals being respectively connected to a pull-up/down (i.e. pull-up or pull-down) resistor, the method comprising:

when the generator generates a determined voltage, a preliminary step for evaluating the series resistance of the sensor, the preliminary step comprising:
the measurement of a first voltage across the output terminals when a first bias voltage is applied on each pull-up/down resistor;
the measurement of a second voltage across the output terminals when a second bias voltage different from the first bias voltage is applied on the pull-up/down resistors; and
the evaluation of the series resistance from the first and second voltages; and
a step for correcting from the series resistor a voltage measured across the output terminals of the sensor in order to infer therefrom a corresponding voltage generated by the generator.

The invention advantageously gives the possibility of compensating for the measurement error affecting a sensor connected to a digital computer, this error being due to the output impedance of the sensor.

According to a first alternative, the voltage to be corrected is the first voltage.

According to a second alternative, the voltage to be corrected is a voltage measured subsequently to said first and second voltages.

In this second alternative, the first bias voltage may be applied on each pull-up resistor when the voltage to be corrected is measured.

In a particular embodiment, the correction step comprises:
the determination of a compensation value depending on the series resistance and on the voltage to be corrected; and
the application of the compensation value to the voltage to be corrected.

On the other hand, said evaluation may be made from the difference between the first and second voltages.

According to a particular embodiment, the predetermined bias voltage is such that the second voltage is comprised within the acquisition range of the sensor during normal operation.

In the latter embodiment, the absolute value of the difference between the first bias voltage and the second bias voltage may be substantially equal to the maximum voltage which the sensor may generate during normal operation.

The invention further relates to a piece of measurement equipment comprising pull-up/down resistors. The piece of equipment being capable of measuring a voltage generated across the output terminals of a sensor when the output terminals are connected to the pull-up/down resistors, wherein the sensor can be assimilated to an assembly comprising a generator and a series resistance, the piece of equipment comprising:

means for successively applying a first bias voltage and a second bias voltage on each of the pull-up/down resistors, the second bias voltage being different from the first bias voltage;
means for measuring, when the generator generates a determined voltage and the first bias voltage is applied on the pull-up/down resistors, a first voltage across the output terminals;
means for measuring, when the generator generates a determined voltage and the second bias voltage is applied on the pull-up/down resistors, a second voltage across the output terminals;

means for evaluating the series resistance from the first and second voltages; and means for correcting, from the series resistance, a voltage measured across the output terminals of the sensor in order to infer therefrom a corresponding voltage generated by the generator.

Moreover, the first bias voltage may be a rated voltage for powering the pull-up/down resistances during normal operation.

According to a first alternative, the voltage to be corrected is the first voltage.

According to a second alternative, the voltage to be corrected is a voltage which is measured subsequently to said first and second voltages.

In a particular embodiment, the correction means are configured for determining a compensation value depending on the series resistance and on the voltage to be corrected, and for applying the compensation value to the voltage to be corrected.

SHORT DESCRIPTION OF THE DRAWINGS

Other features and advantages of the present invention will become apparent from the description made below, with reference to the appended drawings which illustrate an exemplary embodiment thereof without any limitation. In the figures.

DETAILED DESCRIPTION OF AN EMBODIMENT

As indicated earlier, the invention relates to the general field of sensors and more particularly relates to the compensation of measurement errors related to the output impedance of a sensor.

Figure 1:
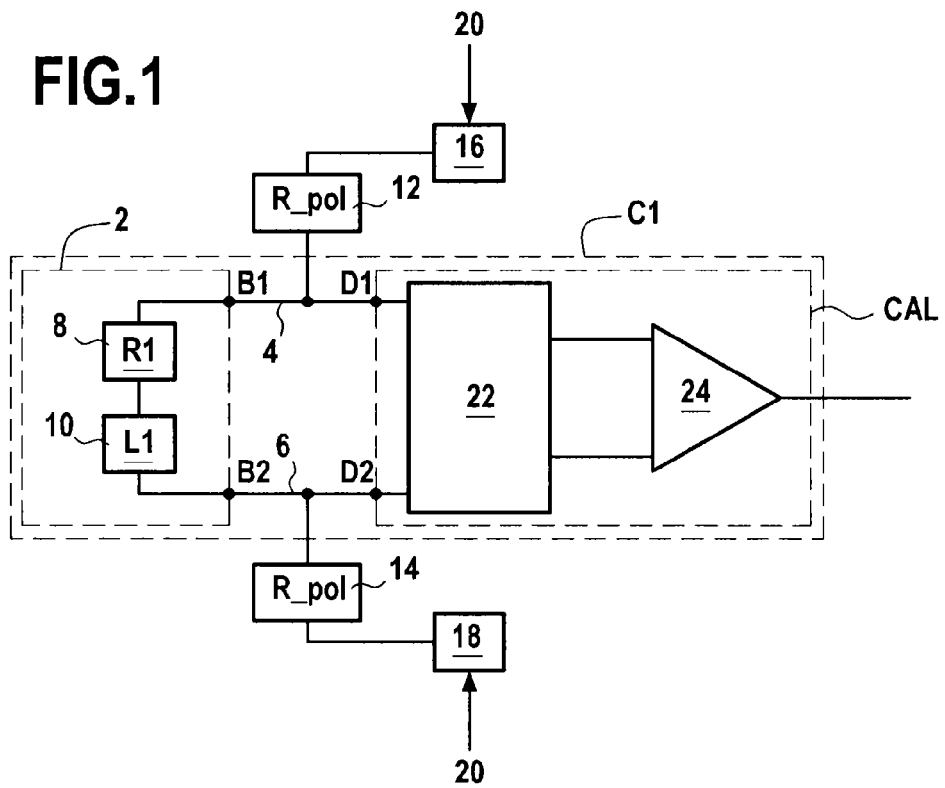
FIG. 1 illustrates in its environment an example of an acquisition chain in differential mode.

A first embodiment of the invention is now described with reference to FIG. 1. In this particular embodiment, the invention allows digital compensation of the error caused by the series impedance of a resistive sensor. More particularly, FIG. 1 illustrates, in its environment, an example of an acquisition chain C1 in which it is intended to correct the measurement error induced by the impedances of a sensor and of a digital computer.

More specifically, this acquisition chain C1 comprises a sensor 2, a digital computer CAL, and two conducting lines 4 and 6 respectively connecting both terminals B1 and B2 of the sensor 2 to the two terminals D1 and D2 of the digital computer CAL.

The sensor 2 may be assimilated to an equivalent voltage generator 10 placed in series with a resistance 8, the value of which is noted as Rcapt.

The value Rcapt depends on the relevant sensor and is provided by the manufacturer. Alternatively, it may be measured during a preliminary step.

In practice, when the sensor 2 is operating, the equivalent voltage generator 10 generates an equivalent voltage Vcapt representative of a physical quantity (temperature, pressure . . . ). This equivalent voltage Vcapt is however affected by the series resistance Rcapt of the sensor 10 so that the output voltage Vmes which is measured across the output terminals B1 and B2 is different from the equivalent voltage Vcapt actually generated by the generator 10. In other words, the output voltage Vmes across the output terminals B1 and B2 comprises an error resulting from the output resistance of the sensor 2. This is why it is necessary to correct the output voltage Vmes measured across the terminals B1 and B2 of the sensor 2 in order to determine the corresponding equivalent voltage Vcapt which is actually generated by the generator 10.

In the example considered here, the sensor 2 is a sensor of the resistive type (a pressure sensor for example). For example this is a gauge bridge. The example shown here is, of course, not limitative. In particular, it will be noted that the sensor 2 may also be an inductive and/or capacitive sensor allowing detection of other variables, such as temperature, pressure, speed, etc. The series resistance of the sensor 2 may thus comprise an inductive element not shown in the figure.

The embodiment contemplated here is achieved in a differential mode. However, the invention may also be applied in a common mode, as described subsequently with reference to FIG. 3.

On the other hand, in addition to being connected to the terminal D1 (respectively D2) of the digital computer CAL, the terminal B1 (respectively B2) of the sensor 2 is connected to a so-called pull-up/down resistor 12 (respectively 14) known to the person skilled in the art. The pull-up resistor 12 corresponds to a high potential level, while the pull-down resistor 14 corresponds to a low potential level. The value of the pull-up and pull-down resistors 12 and 14 is respectively noted as Rpol1 and Rpol2.

In the contemplated example, the pull-up and pull-down resistors 12 and 14 are respectively connected to digital/analog converters 16 and 18, the latter being capable of applying respective bias voltages. These digital/analog converters may themselves be controlled by different components. In this example, the digital/analog converters 16 and 18 are notably controlled by a digital core 20 of an electronic system.

Moreover, the digital computer CAL considered here further comprises a common mode/differential mode filter 22, followed by an amplifier 24, giving the possibility of improving the signal-to-noise ratio of the measurement signal delivered by the sensor 2. The elements forming the digital computer as well as their operating principles are known to the person skilled in the art and will not be further detailed here.

Figure 2:
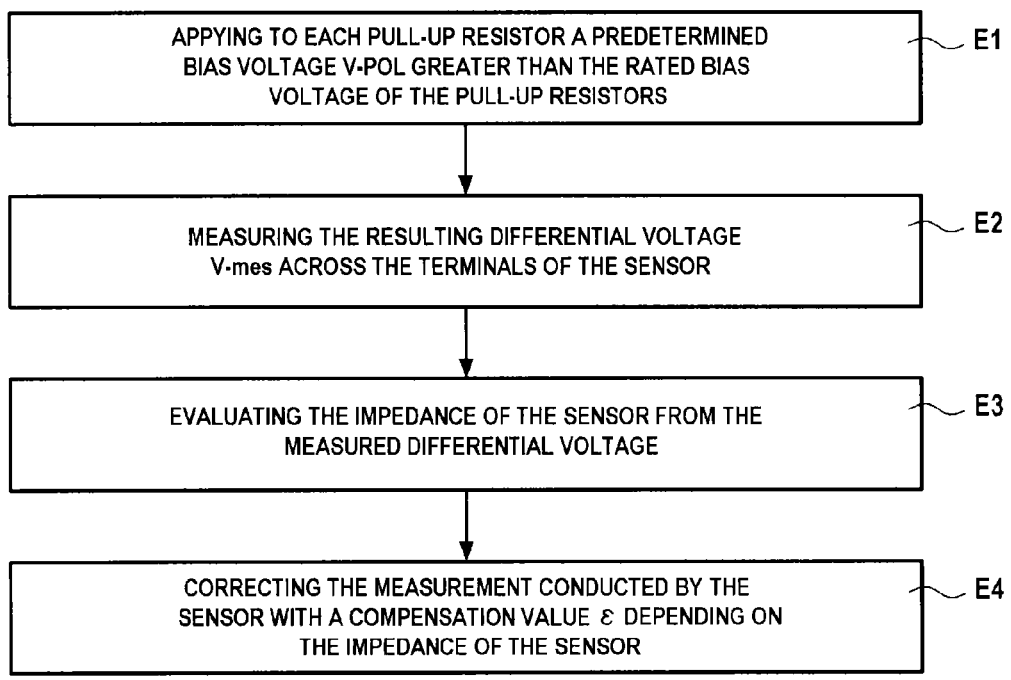
FIG. 2 illustrates the main steps of a correction method according to the invention.

The main steps (E1 and E2) of the correction method of the invention applied to the acquisition chain C1 of FIG. 1 are now described with reference to FIG. 2.

In this embodiment, the correction method is carried out in order to correct an output voltage measured across the output terminals B1 and B2 of the sensor 2.

To do this, a preliminary step E1 is first of all carried out for evaluating the series impedance Rcapt of the measurement sensor 2 (step E1). During this step, the generator 10 generates a determined voltage noted as Vcapt. The step E1 comprises the carrying out of sub-steps E11, E12 and E13.

More specifically, during step E1, the measurement of a first output voltage Vmes1 generated by the sensor 2 is conducted across the output terminals B1 and B2 (sub-step E11). This first voltage Vmes1 is measured by the computer 22 when a first bias voltage Vpol_1 is applied on the pull-up and pull-down (pull-up/down) resistors 12 and 14. This voltage Vpol_1 is a differential voltage applied by the digital/analog converters 16 and 18.

In the embodiment described here, the first bias voltage Vpol_1 is the rated bias voltage of the pull-up and pull-down resistors 12 and 14. However it will be understood that the bias voltage Vpol_1 may be different from the rated bias voltage.

In this document by "rated bias voltage" is meant the bias voltage usually applied to the terminals of the pull-up and pull-down resistors 12 and 14 for guaranteeing normal operation of the sensor 2. This voltage of course depends on the characteristics of the sensor 2 and its determination is within the ordinary skills of the person skilled in the art.

The measurement of a second output voltage Vmes2 generated by the sensor 2 is then conducted across the terminals B1 and B2 (sub-step E12). This second voltage Vmes2 is measured by the computer 22 when a second bias voltage Vpol_2 different from the first bias voltage Vpol_1 is applied on the pull-up and pull-down resistors 12 and 14. This voltage Vpol_2 is also a differential voltage applied on the pull-up and pull-down resistors by the digital/analog converters 16 and 18.

It will be understood that, depending on the type of sensor used or on the diagram of the conditioner, one skilled in the art may decide to inject a positive or negative differential bias voltage on the pull-up/down resistors.

As indicated hereinbefore, it is necessary that the bias voltage Vpol_2 be different from the rated bias voltage Vpol_1 in order to be able to evaluate the series resistance Rcapt.

In practice, the bias voltage Vpol_2 is generally selected so that the second voltage Vmes2 is comprised within the normal acquisition range of the sensor 2, i.e. in the output voltage range of the sensor 2 during normal operation.

Subject to the restriction above, the applicant noticed that the more the deviation (in absolute value) between Vpol_1 and Vpol_2 is significant, the more accurate is the determination of the series resistance of the sensor. Indeed, during normal operation of the sensor 2, the bias voltage Vpol_1 is sufficiently low so as not to perturb the measurement of the output voltage of the sensor 2. However, for specifically evaluating the series impedance Rcapt of the sensor 2, the bias voltage Vpol_2 is selected to be sufficiently strong or sufficiently different from the rated bias voltage Vpol_1, in order to modify the output voltage significantly relatively to normal operation. In this way, it is possible to evaluate the impedance of the sensor 2 with high accuracy.

Typically, Vpol_2 is selected in such a way that the absolute value of the difference between the rated bias voltage Vpol_1 and the predetermined bias voltage Vpol_2 is substantially equal to the maximum voltage Vmax which may be obtained across the output terminals B1 and B2 during normal operation of the sensor 2. One thus has:

|Vpol_1−Vpol_2|=Vmax±10%

In a particular embodiment, one has:

|Vpol_1−Vpol_2|=Vmax±5%

In this way, it is possible to minimize the difference ΔVmes between the voltages Vems1 and Vmes2, respectively measured during sub-steps E11 and E12 across the output terminals B1 and B2 of the sensor 2. A small difference ΔVmes is advantageous in that it allows voltage measurements to be carried out across the terminals B1 and B2 of the sensor without changing the gain of the acquisition chain C1. If the voltages Vmes1 and Vmes2 are close to each other, the error due to the conditioning chain (gain and shift of the chain) is strongly minimized during step E1.

In a particular embodiment, the bias voltage Vpol_2 is set so as to be greater than or equal in absolute value to the rated bias voltage Vpol_1.

Once the sub-steps E11 and E12 are carried out, the series resistance Rcapt of the sensor 2 is evaluated depending on the voltages Vmes1 and Vmes2 obtained during the sub-steps E11 and E22, respectively.

In the present case, the voltages Vmes1 and Vmes2 may be defined according to the following identities (1) and (2):

Identity (1):

$$Vmes1 = Vcapt \cdot \frac{R_{pol1} + R_{pol2}}{R_{capt} + R_{pol1} + R_{pol2}} + \text{Vpol}\_1 \cdot \frac{R_{capt}}{R_{capt} - R_{pol1} + R_{pol2}}$$

Identity (2):

$$Vmes2 = Vcapt \cdot \frac{R_{pol1} + R_{pol2}}{R_{capt} + R_{pol1} + R_{pol2}} + \text{Vpol}\_2 \cdot \frac{R_{capt}}{R_{capt} - R_{pol1} + R_{pol2}}$$

From the identities (1) and (2), it is thus possible to obtain the following identity:

$$\frac{R_{capt}}{R_{capt} + R_{pol1} + R_{pol2}}(\text{Vpol}\_2 - \text{Vpol}\_1) = Vmes2 - Vmes1,$$

which amounts to expressing the series resistance Rcapt according to the following identity (3):

$$R_{capt} = \frac{R_{pol1} + R_{pol2}}{\left(\frac{\text{Vpol}\_2 - \text{Vpol}\_1}{Vmes2 - Vmes1}\right) - 1}$$

Identity (3) gives the possibility of obtaining an exact value of the series resistance Rcapt.

The applicant further determined an alternative way for evaluating the series resistance Rcapt from Vmes1 and Vmes2. The identity (4) above gives the possibility of obtaining an approximated value of Rcapt when the latter is low against the bias resistors Rpol1 and Rpol2:

$$\left[\frac{R_{capt}}{R_{pol1} + R_{pol2}} \cdot \left[1 - o\left[\left(\frac{R_{capt}}{R_{pol1} + R_{pol2}}\right)^2\right]\right] \cdot (\Delta V_{pol\_2} - \Delta V_{pol\_1})\right] \approx$$
$$(V_{mes2} - V_{mes1}).$$

The following identity (4) is thus obtained:

$$R_{capt} \approx (R_{pol1} + R_{pol2}) \cdot \frac{(Vmes2 - Vmes1)}{(Vpol2 - Vpol1)}$$

In the approximation according to identity (4), the second order terms are suppressed. This alternative calculation method is less accurate than identity (3) but simpler to apply for a regulation computer such as the computer 22.

In the present case, for example it is assumed that:
Rpol1=Rpol2=1 MΩ
Vpol_1=−200 mV
Vpol_2=+200 mV.

It is further assumed that the voltage measurement during sub-steps E11 and E12 have respectively resulted in:

Vmes1=99.7 mV
Vmes2=100.1 mV
One thus obtains:
Rcapt=2 kΩ from identity (3), and
Rcapt=1.998 kΩ from identity (4)

Identity (3) thus allows determination of the exact value of Rcapt while identity (4) leads to Rcapt to within an approximation. As such, it is possible to determine the evaluation error (noted as $\epsilon$) introduced into identity (4):

$$\varepsilon = 1 - \frac{R_{capt\_appr}}{R_{capt}}$$

wherein Rcapt_appr is the value of the series resistance 8 obtained by means of identity (4). In the example described here, $\epsilon$=0.1%.

Further, in this example, it is assumed that the voltage Vcapt which is in reality generated by the generator 10 during the measurements in sub-steps E11 and E12, is such that: Vcapt=100 mV. The voltage Vmes1 measured in E11 therefore has an error $\delta V1$ such that:

$\delta V1$=Vmes1−Vcapt=−299.7 μV

It will moreover be noted that in the present case, the difference $\Delta$Vmes in the voltages measured during sub-steps E11 and E12 across the terminals B1 and B2 of the sensor is such that:

$\Delta$Vmes=Vmes2−Vmes1=399.6 μV

As indicated hereinbefore, this difference is sufficiently small for getting rid of the influence of the gain variations of the acquisition chain during measurements of sub-steps E11 and E12.

Once the preliminary evaluation step E1 is carried out, a step E2 for correcting an output voltage measured across the terminals B1 and B2 of the sensor 2 is carried out. This correction step gives the possibility of inferring, from the series resistance Rcapt obtained in step E1, the corresponding voltage Vcapt actually generated by the generator 10 of the sensor 2. Two alternatives may be envisioned within the scope of the invention.

According to a first alternative, the correction step E2 allows correction of the voltage Vmes1 (obtained in sub-step E11) according to the value Rcapt determined beforehand. To do this, the voltage Vcapt1 generated by the generator 10 during the measurement E11 is determined from Rcapt and from Vmes1.

The voltage Vcapt1 may specifically be determined by inserting in identity (1), the value of Rcapt obtained in step E1 by means of the identity (3) or (4).

Alternatively, it is possible to calculate Vcapt1 from the following approximated identity (5):

$$Vmes1 \approx Vcapt1 \cdot \left[1 - \frac{R_{capt\_appr}}{R_{pol1} + R_{pol1}}\right] + Vpol\_1 \cdot \frac{R_{capt\_appr}}{R_{pol1} + R_{pol2}}$$

It is then determined (E2), from the thereby obtained value Vcapt1, the compensation value of Vcomp1 to be added to the voltage Vmes1 for obtaining the corresponding voltage Vcapt1. In other words, Vcomp1 is obtained from the following identity (6):

Vcomp1=Vcapt1−Vmes1

For example by combining the identities (5) and (6), Vcomp1 is defined according to the following identity (7):

$$Vcomp1 = (Vmes1 - Vpol\_1) \cdot \frac{R_{capt\_appr}}{R_{pol1} + R_{pol2}}$$

In the example described here, the following result is obtained from identity (7): Vcomp1=299.401 μV. It may be seen that this compensation value Vcomp1 is very close (in absolute value) to the error $\delta V1$ determined hereinbefore ($\delta V1$=−299.7 μV).

According to a second alternative, the correction step E2 allows correction of a voltage other than the voltage Vmes1 (or Vmes2), i.e. a voltage Vmes3 measured subsequently across the output terminals B1 and B2 of the sensor 2.

To do this, step E2 comprises the measurement of the voltage Vmes3 across the output terminals of the sensor 2. In this example, the bias voltage Vpol_3 applied on the pull-up and pull-down resistors 12 and 14 during the measurement of Vmes3 is the rated voltage of the pull-up/down resistors. Of course, this can be otherwise.

Identity (7) is then used for determining from Vmes3 and from the series resistance Rcapt obtained in step E1, the compensation voltage Vcomp3 such that:

Vcomp3=Vcapt3−Vmes3 wherein Vcapt3 is the corresponding voltage generated by the generator 10 during the measurement of Vmes3. One thus obtains:

$$Vcomp3 = (Vmes3 - Vpol\_1) \cdot \frac{R_{capt\_appr}}{R_{pol1} + R_{pol2}}$$

It is then possible from Vcomp3 to correct the voltage Vmes3 in order to infer therefrom the corresponding voltage Vcapt3 generated by the generator 10 of the sensor 2.

According to this second alternative, it is therefore not necessary to determine the value of the equivalent voltage Vcapt1 provided by the generator 10 in sub-step E11. The measurement of the voltage Vmes1 (and of Vmes2) is only used for determining the series resistance Rcapt of the sensor 2. It is then possible from this value Rcapt to correct any voltage measured across the output terminals B1 and B2 of the sensor. This arbitrary voltage may have been measured before or after the preliminary step E1 for evaluating the series impedance Rcapt.

The invention also allows to correct from the value Rcapt, a plurality of voltages successively measured across the output terminals B1 and B2 of the sensor 2.

It will be noted moreover that the method according to the invention may both be applied to sensors intended to receive DC bias voltages (sensor of the continuous type) and to sensors intended to receive AC bias voltages (sensor of the alternating type).

If the sensor 2 is of the continuous type, the applied bias voltage V_pol is also a DC voltage. If however on the other hand the sensor 2 is of the alternating type, an AC bias voltage V_pol, for example at the useful frequency $f_0$ of the relevant sensor 2, is applied on the pull-up and pull-down resistors 12 and 14. The impedance of the sensor 2 will thus be inferred at its useful frequency $f_0$.

By useful frequency $f_0$ of the sensor is meant here the usual operating frequency of the sensor, which is predefined and indicated by the manufacturer of the sensor. It should also be noted that certain types of inductive sensors, such as phonic wheels for example, are characterized by a useful frequency range. In this case the bias variation frequency is preferably selected so as to attain a maximum of sensitivity for the sensor, cable and conditioner (or computer) assembly.

The invention also relates to a piece of measurement equipment capable of applying the correction method of the invention. In the embodiment of FIG. 1, the piece of measurement equipment comprises:

- the computer 22 which is capable of measuring the output voltage Vmes present across the output terminals B1 and B2 of the sensor 2,
- the pull-up and pull-down resistors 12 and 14 which are connected to the output terminals B1 and B2 of the sensor 2, and
- the converters 16 and 18 capable of applying different bias voltages onto the pull-up and pull-down resistors 12 and 14.

Figure 3:
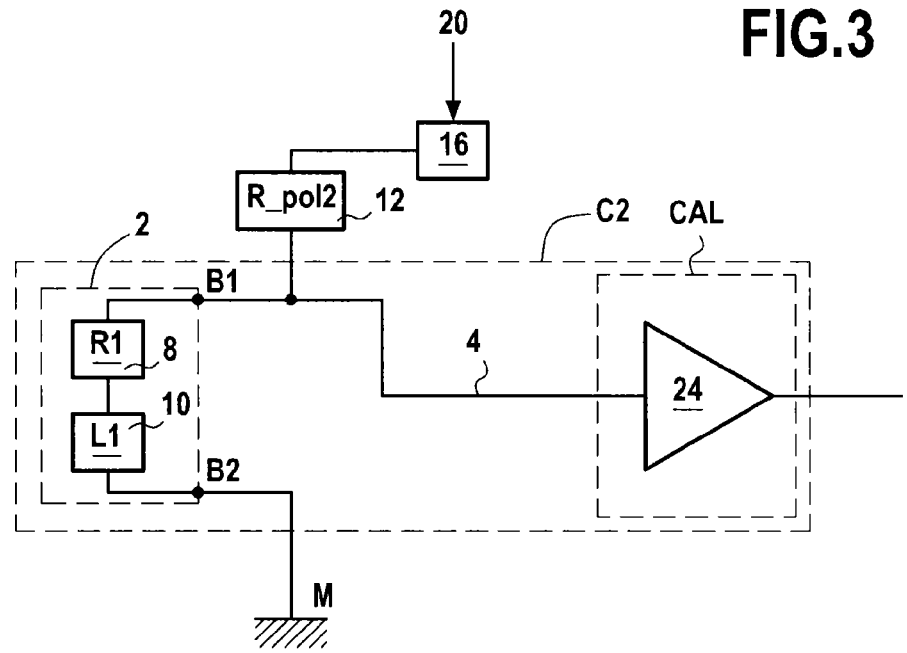
FIG. 3 illustrates in its environment an example of an acquisition chain in common mode.

On the other hand FIG. 3 illustrates an embodiment wherein the acquisition chain (noted as C2) is mounted in a common mode.

In this example, the acquisition chain C2 comprises a sensor 2 and a digital computer CAL. On the other hand, as compared with the acquisition chain C1 of FIG. 1, a single conducting line 4 connects the sensor 2 to the computer CAL.

More specifically, the digital computer CAL comprises an amplifier 24. The terminal B2 of the sensor 2 is connected to the ground M, while the other terminal B1 is connected to the pull-up resistor 12 through the conducting line 4. Further, the pull-up resister 12 corresponds to a high potential level. This example of course is non-limiting. The sensor 2 may for example be connected to a single pull-down resistor, this time with a low potential level.

The correction method according to the invention is applied to the acquisition chain C2 in the same way as for the chain C1, the measurement of the sensor 2 this time being dependent on the voltage on the terminal B1 relatively to the ground.

The invention claimed is:

1. A method for correcting measurement of a voltage across a first output terminal and a second output terminal of a sensor, the sensor including a generator and a series resistance, and the first output terminal and the second output terminal being connected to a pull-up resistor and a pull-down resistor, respectively, the method comprising:
   when the generator generates a predetermined voltage, performing a preliminary operation to evaluate the series resistance of the sensor, the preliminary operation including:
      measuring a first voltage across the first output terminal and the second output terminal when a first bias voltage is applied to the pull-up resistor and to the pull-down resistor;
      measuring a second voltage across the first output terminal and the second output terminal when a second bias voltage different from the first bias voltage is applied to the pull-up resistor and to the pull-down resistor; and
      evaluating the series resistance based on the first voltage and the second voltage; and
   correcting, based on the evaluated series resistance, a third voltage measured across the first output terminal and the second output terminal of the sensor to correspond to the predetermined voltage generated by the generator.

2. The correction method according to claim 1, wherein the third voltage corresponds to the first voltage.

3. The correction method according to claim 1, wherein the third voltage is measured subsequent to the first voltage and the second voltage.

4. The correction method according to claim 3, wherein the first bias voltage is applied to the pull-up resistor and to the pull-down resistor when the third voltage is measured.

5. The correction method according to claim 1, wherein said correcting includes:
   determining a compensation value based on the evaluated series resistance and the third voltage; and
   applying the compensation value to the third voltage.

6. The correction method according to claim 1, wherein said evaluating is based on calculating a difference between the first voltage and the second voltage.

7. The correction method according to claim 1, wherein the second bias voltage is selected to be applied such that the second voltage is within an acquisition range of the sensor during a normal operation.

8. The correction method according to claim 7, wherein an absolute value of a difference between the first bias voltage and the second bias voltage is substantially equal to a maximum voltage generated by the generator during the normal operation.

9. The correction method according to claim 1, wherein the first bias voltage and the second bias voltage are applied by a first digital/analog converter and a second digital/analog converter, respectively.

10. The correction method according to claim 9, wherein the first digital/analog converter and the second digital/analog converter are connected to the pull-up resistor and the pull-down resistor, respectively.

11. The correction method according to claim 1, wherein a second absolute value of the second bias voltage is greater than a first absolute value of the first bias voltage.

12. The correction method according to claim 1, wherein an absolute value of a difference between the first bias voltage and the second bias voltage is substantially equal to a maximum voltage measured across the first output terminal and the second output terminal.

13. A measurement equipment comprising:
   a pull-up resistor and a pull-down resistor, the measurement equipment being configured to measure a voltage generated across a first output terminal and a second output terminal of a sensor when the first output terminal and the second output terminal are connected to the pull-up resistor and the pull-down resistor, respectively, the sensor including a generator and a series resistance; and
   circuitry configured to:
      successively apply a first bias voltage and a second bias voltage to the pull-up resistor and to the pull-down resistor, the second bias voltage being different from the first bias voltage;
      measure, when the generator generates a predetermined voltage and when the first bias voltage is applied to the pull-up resistor and to the pull-down resistor, a first voltage across the first output terminal and the second output terminal;
      measure, when the generator generates the predetermined voltage and when the second bias voltage is applied to the pull-up resistor and to the pull-down resistor, a second voltage across the first output terminal and the second output terminal;
      evaluate the series resistance based on the first voltage and the second voltage; and
      correct, based on the evaluated series resistance, a third voltage measured across the first output terminal and the second output terminal of the sensor to correspond to the predetermined voltage generated by the generator.

14. The measurement equipment according to claim 13, wherein the first bias voltage is a rated voltage for powering the pull-up resistor and the pull-down resistor during a normal operation.

15. The measurement equipment according to claim 13, wherein the third voltage corresponds to the first voltage.

16. The measurement equipment according to claim 13, wherein the third voltage is measured subsequent to the first voltage and the second voltage.

17. The measurement equipment according to claim 13, wherein the circuitry is configured to determine a compensation value based on the evaluated series resistance and the third voltage and to apply the compensation value to the third voltage.

* * * * *